(12) United States Patent
Shen et al.

(10) Patent No.: US 11,990,167 B2
(45) Date of Patent: May 21, 2024

(54) MAGNETIC TUNNEL JUNCTION DEVICE AND METHOD OF FORMING SAME

(71) Applicant: Taiwan Semiconductor Manufacturing Co., Ltd., Hsinchu (TW)

(72) Inventors: Bo-Jhih Shen, Tainan (TW); Kuang-I Liu, Hsinchu (TW); Joung-Wei Liou, Zhudong Town (TW); Jinn-Kwei Liang, Yongkang (TW); Yi-Wei Chiu, Kaohsiung (TW); Chin-Hsing Lin, Chiayi (TW); Li-Te Hsu, Shanhua Township (TW); Han-Ting Tsai, Kaoshiung (TW); Cheng-Yi Wu, Taichung (TW); Shih-Ho Lin, Jhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 207 days.

(21) Appl. No.: 17/352,658

(22) Filed: Jun. 21, 2021

(65) Prior Publication Data
US 2021/0312965 A1     Oct. 7, 2021

Related U.S. Application Data

(62) Division of application No. 16/565,640, filed on Sep. 10, 2019, now Pat. No. 11,043,251.
(Continued)

(51) Int. Cl.
*G11C 11/16* (2006.01)
*H10B 61/00* (2023.01)
(Continued)

(52) U.S. Cl.
CPC ............ *G11C 11/161* (2013.01); *H10B 61/00* (2023.02); *H10N 50/01* (2023.02); *H10N 50/10* (2023.02);
(Continued)

(58) Field of Classification Search
CPC .......... G11C 11/161; G11C 2211/5615; G11B 5/3909; H01L 43/12
See application file for complete search history.

(56) References Cited

U.S. PATENT DOCUMENTS

| | | | |
|---|---|---|---|
| 10,103,322 B1 | 10/2018 | Teng et al. | |
| 10,270,026 B2 * | 4/2019 | Chuang | H10N 50/85 |

(Continued)

FOREIGN PATENT DOCUMENTS

| | | |
|---|---|---|
| CN | 103985672 A | 8/2014 |
| CN | 106104830 A | 11/2016 |

(Continued)

*Primary Examiner* — Nicholas J Tobergte
(74) *Attorney, Agent, or Firm* — Slater Matsil, LLP

(57) ABSTRACT

A semiconductor device and a method of forming the same are provided. The method includes forming a bottom electrode layer over a substrate. A magnetic tunnel junction (MTJ) layers are formed over the bottom electrode layer. A top electrode layer is formed over the MTJ layers. The top electrode layer is patterned. After patterning the top electrode layer, one or more process cycles are performed on the MTJ layers and the bottom electrode layer. A patterned top electrode layer, patterned MTJ layers and a patterned bottom electrode layer form MTJ structures. Each of the one or more process cycles includes performing an etching process on the MTJ layers and the bottom electrode layer for a first duration and performing a magnetic treatment on the MTJ layers and the bottom electrode layer for a second duration.

20 Claims, 14 Drawing Sheets

Related U.S. Application Data

(60) Provisional application No. 62/773,398, filed on Nov. 30, 2018.

(51) Int. Cl.
  *H10N 50/01* (2023.01)
  *H10N 50/10* (2023.01)
  *H10N 50/85* (2023.01)
  G01R 33/09 (2006.01)
  G11B 5/39 (2006.01)

(52) U.S. Cl.
  CPC ........... *H10N 50/85* (2023.02); *G01R 33/098* (2013.01); *G11B 5/3909* (2013.01); *G11C 2211/5615* (2013.01)

(56) References Cited

U.S. PATENT DOCUMENTS

| | | |
|---|---|---|
| 10,516,100 B2 | 12/2019 | Sundar et al. |
| 10,770,652 B2 | 9/2020 | Marchack et al. |
| 2006/0051881 A1 | 3/2006 | Ditizio |
| 2009/0224341 A1 | 9/2009 | Li |
| 2012/0282711 A1 | 11/2012 | Abedifard et al. |
| 2013/0126995 A1 | 5/2013 | Ogihara |
| 2014/0063895 A1* | 3/2014 | Li ........................... G11C 17/16 365/97 |
| 2014/0227802 A1 | 8/2014 | Hsu et al. |
| 2015/0035031 A1 | 2/2015 | Kim |
| 2015/0092481 A1 | 4/2015 | Lee et al. |
| 2015/0287910 A1 | 10/2015 | Lu et al. |
| 2016/0035969 A1 | 2/2016 | Kang et al. |
| 2016/0225979 A1 | 8/2016 | Hsu et al. |
| 2016/0276575 A1 | 9/2016 | Nam et al. |
| 2016/0308112 A1 | 10/2016 | Tan et al. |
| 2016/0380183 A1 | 12/2016 | Chuang et al. |
| 2017/0033282 A1 | 2/2017 | Wang et al. |
| 2017/0186946 A1 | 6/2017 | Hsu et al. |
| 2017/0263861 A1 | 9/2017 | Park et al. |
| 2019/0245139 A1* | 8/2019 | Chuang .................. H10N 50/80 |

FOREIGN PATENT DOCUMENTS

| | | |
|---|---|---|
| KR | 20110074559 A | 6/2011 |
| KR | 20150036987 A | 4/2015 |
| KR | 20160015507 A | 2/2016 |
| TW | 201503439 A | 1/2015 |
| TW | 201705465 A | 2/2017 |
| TW | 201712909 A | 4/2017 |
| WO | 2010036581 A1 | 4/2010 |

\* cited by examiner

MAGNETIC TUNNEL JUNCTION DEVICE AND METHOD OF FORMING SAME

PRIORITY CLAIM AND CROSS-REFERENCE

This application is a division of U.S. patent application Ser. No. 16/565,640, filed on Sep. 10, 2019, entitled "Magnetic Tunnel Junction Device and Method of Forming Same," now U.S. Pat. No. 11,043,251, issued Jun. 22, 2021, which claims the benefit of U.S. Provisional Application No. 62/773,398, filed on Nov. 30, 2018, which application is hereby incorporated herein by reference.

BACKGROUND

Semiconductor memories are used in integrated circuits for electronic applications, including radios, televisions, cell phones, and personal computing devices, as examples. One type of semiconductor memory device is Magneto-Resistive Random Access Memory (MRAM), which involves spin electronics that combines semiconductor technology and magnetic materials and devices. The spins of electrons, through their magnetic moments, rather than the charge of the electrons, are used to indicate bit values.

A typical MRAM cell may include a Magnetic Tunnel Junction (MTJ) stack, which includes a pinning layer, a pinned layer over the pinning layer, a tunnel layer over the pinned layer, and a free layer over the tunnel layer. During the formation of the MRAM cell, a plurality of blanket layers are deposited first. The blanket layers are then patterned through a photo etching to form the MTJ stack. A cap dielectric layer is then formed to include some portions on the sidewalls, and possibly additional portions over the top surface, of the MTJ stacks. The MTJ stack is protected by the cap dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
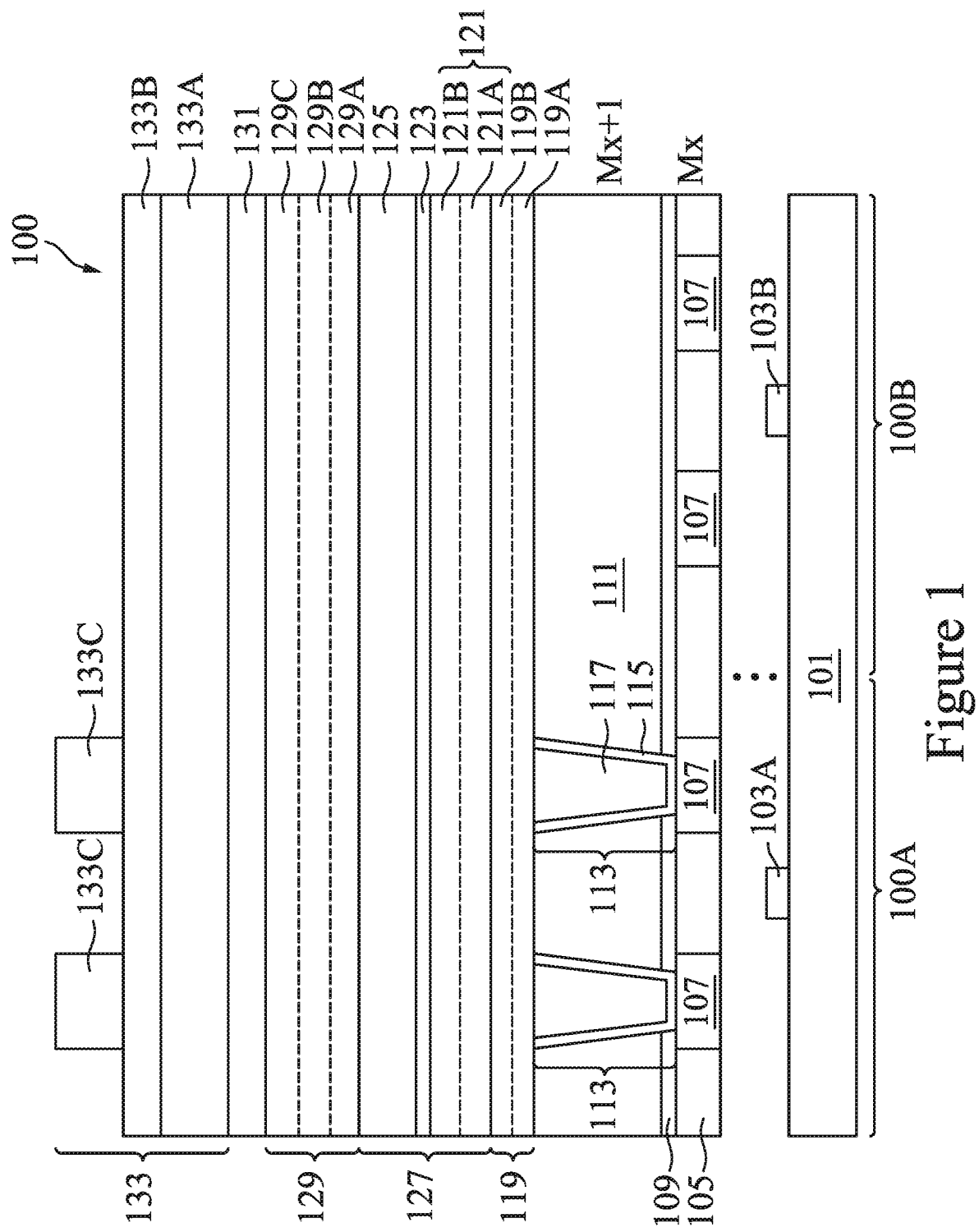
FIGS. 1 through 9 are cross-sectional views of intermediate stages in the formation of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of a semiconductor device, such as a Magnetic Tunnel Junction (MTJ) device and a method of forming the same. In some embodiments, the MTJ device may be a Magneto-Resistive Random Access Memory (MRAM) device. The intermediate stages of forming an MTJ device are illustrated in accordance with some embodiments. In accordance with some embodiments, a magnetic treatment is performed on MTJ layers while performing an etching process to pattern the MTJ layers, so that the electrical shorting caused by the re-sputtering of metal elements on sidewalls of the patterned MTJ layers occurring during the etching process is avoided. In accordance with some embodiments, various layers are formed on the sidewalls of the patterned MTJ layers, so that electron flow along the sidewalls of the patterned MTJ layers is reduced or avoided and moisture ($H_2O$) diffusion into the patterned MTJ layers is reduced or avoided.

FIGS. 1 through 9 are cross-sectional views of intermediate stages in the formation of a semiconductor device 100 in accordance with some embodiments. Referring to FIG. 1, the semiconductor device 100 includes a memory region 100A and a logic region 100B over a same substrate 101, where one or more memory devices (e.g., MRAM devices) are formed in the memory region 100A and one or more logic devices (e.g., logic circuits) are formed in the logic region 100B. In some embodiments, electrical components 103A and 103B are formed in or on the substrate 101, and an interconnect structure, which includes a plurality of dielectric layers and electrically conductive features (e.g., metal lines and vias) formed in the dielectric layers, is formed over the substrate 101 to connect the electrical components 103A and 103B to form functional circuits of the semiconductor device 100.

The substrate 101 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The electrical components 103A and 103B may be, e.g., transistors, diodes, capacitors, resistors, or the like, formed by any suitable formation method.

In some embodiments, the interconnect structure comprises a plurality of metallization layers that are formed over the substrate 101 and the electrical components 103A and 103B. The metallization layers are denoted as $M_x$, where x=0, 1, 2, . . . , where $M_0$ refers to the lowest (e.g., closest to the substrate 101) metallization layer, and the index x increases by 1 for each additional metallization layer. The metallization layer $M_0$ comprises one or more Inter-Layer Dielectric (ILD) layers and electrically conductive features, such as contact plugs, within the ILD layer(s) to electrically connect to the electrical components 103A and 103B. The metallization layer $M_x$ (with x greater or equal to 1) comprises an Inter-Metal Dielectric (IMD) layer and electrically conductive features (e.g., metal lines and vias) within the IMD layer. In some embodiments, electrically conductive features, such as conductive lines and vias, provide electrical connection to underlying conductive features.

The ILD layer(s) and the IMD layers may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The ILD layer(s) and the IMD layers may be formed by any acceptable deposition process, such as spin coating, physical vapor deposition (PVD), chemical vapor deposition (CVD), the like, or a combination thereof. The electrically conductive features in the ILD layer(s) and the IMD layers may be formed through any suitable process, such as deposition, damascene, dual damascene, the like, or combinations thereof.

FIG. 1 illustrates metallization layers $M_x$ and $M_{x+1}$ over the substrate 101. In some embodiments, the metallization layer $M_x$ may be the metallization layer Mo and may contact the substrate 101. In other embodiments, other metallization layers may be interposed between the metallization layer $M_x$ and the substrate 101. For simplicity, in subsequent figures, the substrate 101 and the electrical components 103A and 103B may not be illustrated.

In some embodiments, the metallization layer $M_x$ comprises a dielectric layer 105 and conductive features 107 within the dielectric layer 105. In some embodiments, the dielectric layer 105 is a low-k dielectric layer having a k value lower than about 3.0, for example. The dielectric layer 105 may also be formed of another dielectric material such as silicon oxide, silicon nitride, Phospho-Silicate Glass (PSG), Boro-Silicate Glass (BSG), Boron-Doped Phospho-Silicate Glass (BPSG), or the like. The conductive features 107 may be formed of metals such as copper, aluminum, tungsten, cobalt, metal alloys thereof, or the like. In some embodiments where the metallization layer $M_x$ is the metallization layer $M_0$, the conductive features 107 are contact plugs. In other embodiments where the metallization layer $M_x$ is a metallization layer with x greater than 1, the conductive features 107 may be metal lines (such as word lines or bit lines), metal vias, doped semiconductor strips, or the like.

In some embodiments, the metallization layer $M_{x+1}$ comprises a dielectric layer 111 and conductive features 113, such as conductive vias 113, within the dielectric layer 111. In some embodiments, the dielectric layer 111 may be formed of a TEOS oxide (silicon oxide deposited using, e.g., a Chemical Vapor Deposition (CVD) method with Tetra Ethyl Ortho Silicate (TEOS) as a precursor). In other embodiments, the dielectric layer 111 may be formed using PSG, BSG, BPSG, Undoped Silicate Glass (USG), Fluoro-silicate Glass (FSG), SiOCH, flowable oxide, a porous oxide, or the like, or combinations thereof. The dielectric layer 111 may also be formed of a low-k dielectric material with a k value lower than about 3.0, for example.

In some embodiments, the conductive vias 113 include conductive regions 117 and conductive barrier layers 115 lining sidewalls and bottom surfaces of the conductive regions 117. The conductive barrier layers 115 may be formed of titanium, titanium nitride, tantalum, tantalum nitride, cobalt, a combination thereof, or the like. The conductive regions 117 may be formed of metals such as copper, aluminum, tungsten, cobalt, alloys thereof, or the like. The formation of vias 113 may include etching the dielectric layer 111 to form via openings, forming a blanket conductive barrier layer extending into the via openings, depositing a metallic material over the blanket conductive barrier layer, and performing a planarization process, such as a Chemical Mechanical Polish (CMP) process or a mechanical grinding process, to remove excess portions of the blanket conductive barrier layer and the metallic material.

In some embodiments, an etch stop layer 109 is formed between the dielectric layer 105 and the dielectric layer 111. In some embodiments, the etch stop layer 109 is formed of a dielectric layer that is different from the overlying dielectric layer 111. For example, the etch stop layer 109 may be formed of aluminum nitride, aluminum oxide, silicon oxide, silicon nitride, silicon oxynitride, silicon carbide, a combination thereof, or the like. The etch stop layer 109 may also be a composite layer formed of a plurality of dielectric layers. For example, the etch stop layer 109 may include a metal oxide layer, a metal nitride layer over the metal oxide layer, and may or may not include a metal oxynitride layer or a metal carbo-nitride layer over the metal nitride layer. In such embodiments, the formation of vias 113 further includes etching the etch stop layer 109 while forming the via openings.

Referring further to FIG. 1, a bottom electrode (BE) layer 119 is formed over the dielectric layer 111 and the vias 113, magnetic tunnel junction (MTJ) layers 127 are formed over the BE layer 119, and a top electrode (TE) layer 129 is formed over the MTJ layers 127. In some embodiments, the BE layer 119 is formed as a blanket layer, and may be formed using CVD, Physical Vapor Deposition (PVD), Electro-Chemical Plating (ECP), Electroless plating, or the like. The material of the BE layer 119 may include Cu, Al, Ti, Ta, W, Pt, Ni, Cr, Ru, TiN, TaN, combinations thereof, multi-layers thereof, or the like. In an embodiment where the BE layer 119 comprises a multilayer, the BE layer 119 comprises a first layer 119A and a second layer 119B over the first layer 119A, with the first layer 119A being made of TaN and the second layer 119B being made of TiN. In some embodiments, the first layer 119A has a thickness between about 20 Å and about 150 Å. In some embodiments, the second layer 119B has a thickness between about 30 Å and about 150 Å. In some embodiments, the BE layer 119 has a thickness between about 50 Å and about 300 Å.

In some embodiments, the MTJ layers 127 include a bottom magnetic electrode layer 121, a tunnel barrier layer 123 over the bottom magnetic electrode layer 121, and a top magnetic electrode layer 125 over the tunnel barrier layer 123. The bottom magnetic electrode layer 121 may include a pinning layer 121A and a pinned layer 121B over and contacting the pinning layer 121A. The top magnetic electrode layer 125 may include a free layer. The bottom magnetic electrode layer 121, the tunnel barrier layer 123, and the top magnetic electrode layer 125 may be deposited using one or more deposition methods such as, CVD, PVD, ALD, a combination thereof, or the like.

The pinning layer 121A may be formed of a metal alloy including manganese (Mn) and another metal(s) such as platinum (Pt), iridium (Ir), rhodium (Rh), nickel (Ni), palladium (Pd), iron (Fe), osmium (Os), or the like. Accordingly, the pinning layer 121A may be formed of PtMn, IrMn, RhMn, NiMn, PdPtMn, FeMn, Os, Mn, or the like. The pinning layer 121A may have a thickness in the range between about 50 Å and about 200 Å.

The pinned layer 121B may be formed of a ferromagnetic material with a greater coercivity field than top magnetic electrode layer 125, and may be formed of materials such as cobalt iron (CoFe), cobalt iron boron (CoFeB), a combination thereof, or the like. The pinned layer 121B may have a thickness in the range between about 50 Å and about 200 Å. In some embodiments, the pinned layer 121B has a synthetic ferromagnetic (SFM) structure, in which the coupling between magnetic layers is ferromagnetic coupling. The bottom magnetic electrode layer 121 may also adopt a synthetic antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, The bottom magnetic electrode layer 121 may have a Co layer and repeated (Pt/Co)x layers over the Co layer, with x representing repeating number and may be any integer equal to or greater than 1.

The tunnel barrier layer 123 may be formed of a dielectric material, such as MgO, AlO, AlN, a combination thereof, or the like. The tunnel barrier layer 123 may have a thickness in the range between about 1 nm and about 10 nm.

The top magnetic electrode layer 125 may be formed of a ferromagnetic material such as CoFe, NiFe, CoFeB, CoFeBW, a combination thereof, or the like. The top magnetic electrode layer 125 may also adopt a synthetic ferromagnetic structure, which is similar to the SAF structure, with the thickness of the spacer layer adjusted to achieve the ferromagnetic coupling between the separated magnetic metals, i.e, causing the magnetic moment to be coupled in the same direction. The magnetic moment of the top magnetic electrode layer 125 is programmable, and the resistance of the resulting MTJ structure is accordingly changed between a high resistance and a low resistance. It is realized that the materials and the structure of the MTJ layers 127 may have many variations, which are also within the scope of the present disclosure. For example, layers 121A, 121B, 123, and 125 may be formed in an order inversed from what is shown in FIG. 1. Accordingly, the free layer may be the bottom layer of MTJ layers 127, while the pinning layer may be the top layer.

Referring further to FIG. 1, the TE layer 129 is formed over the MTJ layers 127. In some embodiments, the TE layer 129 is formed as a blanket layer, and may be formed using CVD, PVD, ECP, electroless plating, or the like. The material of the TE layer 129 may include aluminum, titanium, tantalum, tungsten, alloys thereof, multi-layers thereof, or the like. In some embodiments, the TE layer 129 may be used as a hard mask in the subsequent patterning of the MTJ layers 127 and may include a conductive layer formed of TiN, Ta, TaN, Ti, Ru, W, Si, alloys thereof, multi-layers thereof, or the like.

In an embodiment where the TE layer 129 comprises a multilayer, the TE layer 129 may comprise a first layer 129A, a second layer 129B over the first layer 129A, and a third layer 129C over the second layer 129B, with the first layer 129A being made of Ta, the second layer 129B being made of TaN, and the third layer 129C being made of Ta. In some embodiments, the first layer 129A has a thickness between about 50 Å and about 200 Å. In some embodiments, the second layer 129B has a thickness between about 50 Å and about 200 Å. In some embodiments, the third layer 129C has a thickness between about 50 Å and about 200 Å. In some embodiments, the TE layer 129 has a thickness between about 100 Å and about 600 Å. In some embodiments, the thickness of the TE layer 129 is greater than the thickness of the BE layer 119.

After forming the TE layer 129, one or more masks are formed over the TE layer 129. In some embodiments, the one or more masks may comprise one or more hard masks, a tri-layer mask, a combination thereof, or the like. In some embodiments, a hard mask layer 131 is formed over the TE layer 129 and a tri-layer mask 133 is formed over the hard mask layer 131. In some embodiments, the hard mask layer 131 may comprise TiO, a TEOS oxide, a combination thereof, or the like. In some embodiments, the hard mask layer 131 has a thickness between about 50 Å and about 300 Å.

The tri-layer mask 133 comprises a bottom layer 133A, a middle layer 133B over the bottom layer 133A, and a top layer 133C over the middle layer 133B. In some embodiments, the bottom layer 133A is formed of a photo resist. In some embodiments, the bottom layer 133A is cross-linked, and hence is different from typical photo resists used for light exposure. In other embodiments, the bottom layer 133A comprises amorphous carbon (a-C). The bottom layer 133A may function as a Bottom Anti-Reflective Coating (BARC) when top layer 133C is light-exposed. The middle layer 133B may comprise a material including silicon and oxygen, which may be SiON, for example, while other similar materials may be also used. The top layer 133C may comprise a photo resist. In some embodiments, the top layer 133C is coated as a blanket layer, and is then patterned in a photo lithography process using a photo lithography mask. In a top view of the semiconductor device 100, the remaining portions of the top layer 133C may be arranged as an array.

Figure 2:
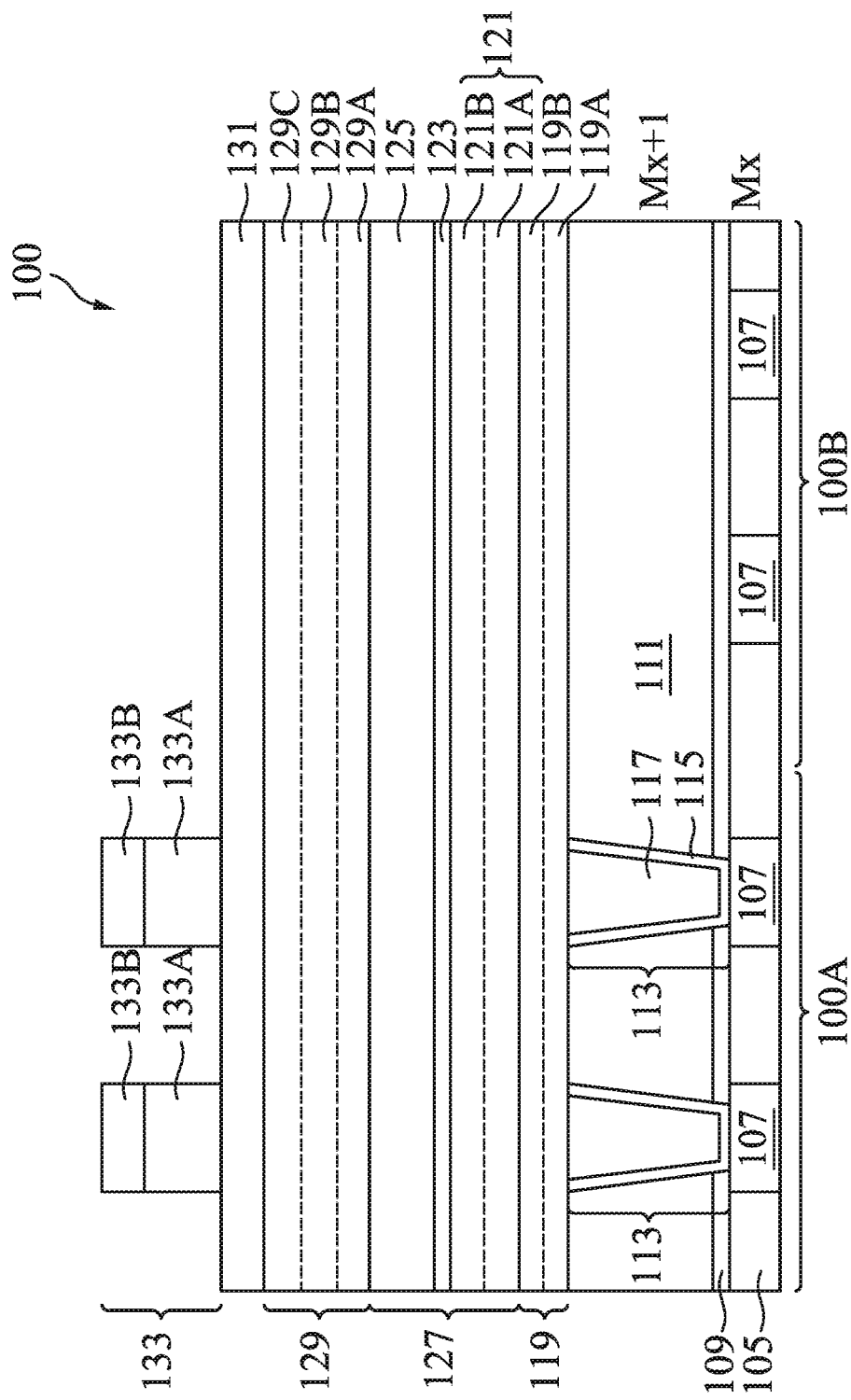

Referring to FIG. 2, the patterned top layer 133C (see FIG. 1) is used as an etching mask to etch and pattern the middle layer 133B and the bottom layer 133A of the tri-layer mask 133. In some embodiments, the patterned top layer 133C (see FIG. 1) may be consumed in the etching process. In some embodiments, the etching process may comprise an anisotropic dry etching process, such as reactive ion etching (RIE) process, ion beam etching (IBE) process, a combination thereof, or the like.

Figure 3:
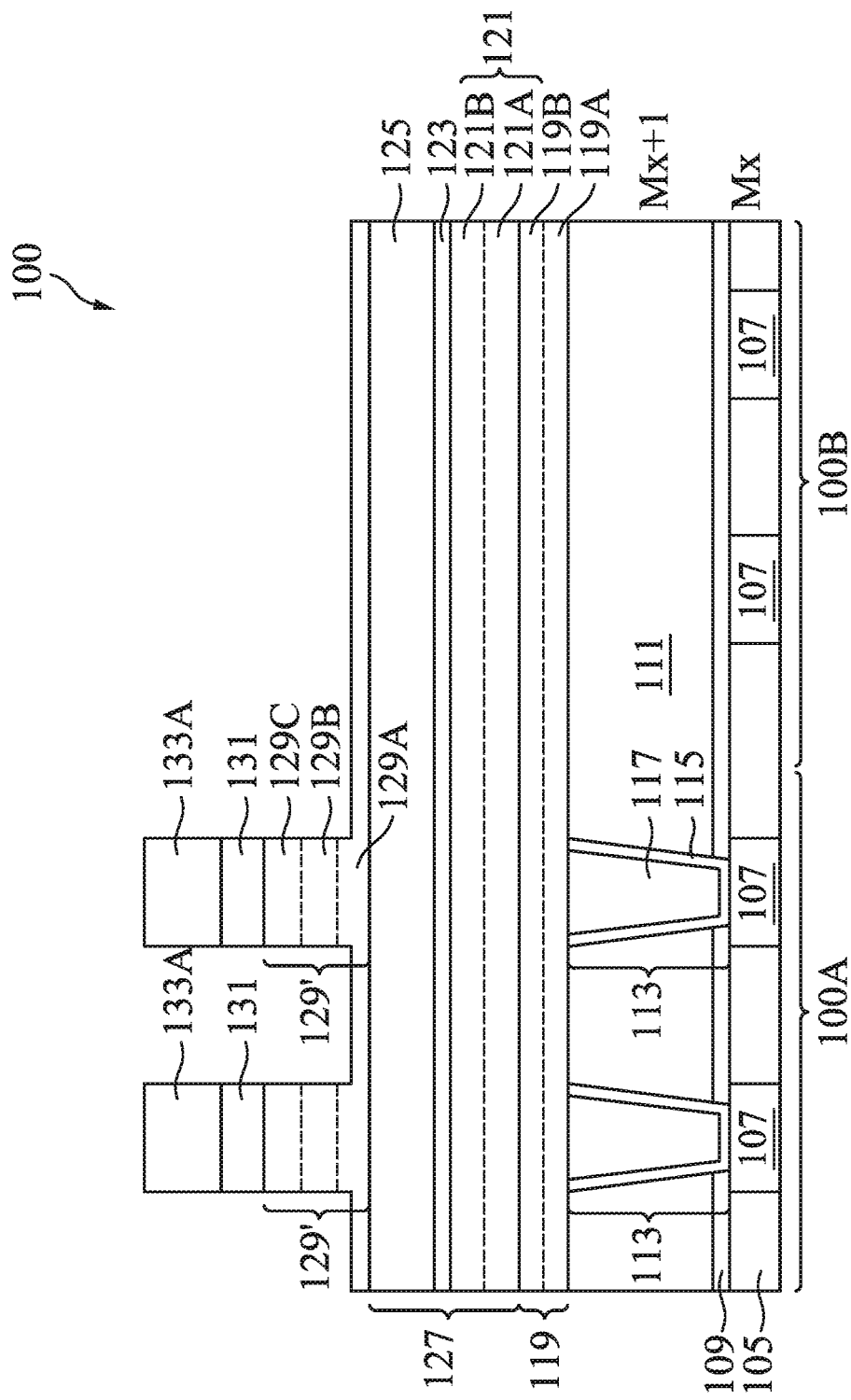

Referring to FIG. 3, the patterned middle layer 133B (see FIG. 2) and the patterned bottom layer 133A are used as an etching mask to etch the hard mask layer 131 and the TE layer 129, forming top electrodes (TEs) 129'. The etching method may include a plasma etching method, which may include reactive Ion Beam Etching (IBE). The etching may be implemented using Glow Discharge Plasma (GDP), Capacitive Coupled Plasma (CCP), Inductively Coupled Plasma (ICP), or the like. The patterned middle layer 133B (see FIG. 2) may be consumed in the etching process. In some embodiments, the etching process may not fully etch the first layer 129A of the TE layer 129. In such embodiments, after performing the etching process, a portion of the first layer 129A of the TE layer 129 remains covering the MTJ layers 127. In some embodiments, the portion of the first layer 129A of the TE layer 129 remaining over the MTJ layers 127 has a thickness between about 10 Å and about 50 Å.

Figure 4:
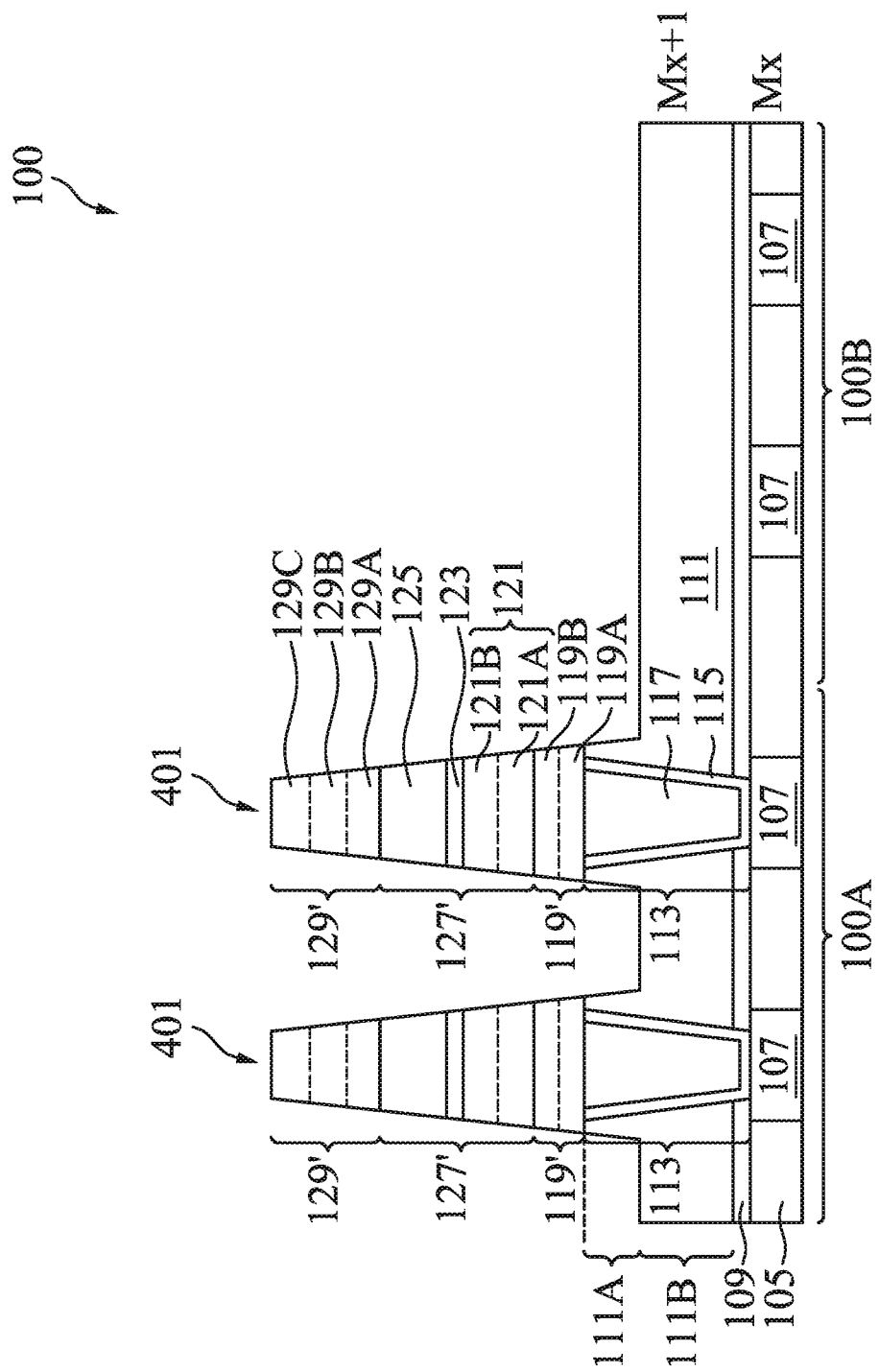

Referring to FIG. 4, the MTJ layers 127 and the BE layer 119 are patterned using one or more etching processes, while using the patterned bottom layer 133A (see FIG. 3), the patterned hard mask layer 131 (see FIG. 3), and the TEs 129' as an etch mask. The patterning process forms MTJs 127' and BEs 119'. In some embodiment, the patterning process may partially etch the dielectric layer 111. In such embodiments, the dielectric layer 111 comprises etched portions 111A and un-etched portion 111B. In some embodiments, top surfaces of the etched portions 111A are above a top surface of the un-etched portion 111B. In some embodiments, the etched portions 111A have sloped sidewalls. In some embodiments, the etched portions 111A have trapezoidal shapes in the illustrated cross-section. In some embodiments, the patterned bottom layer 133A (see FIG. 3) and the patterned hard mask layer 131 (see FIG. 3) may consumed during the patterning process. In other embodiments, portions of the patterned bottom layer 133A (see FIG. 3) and the patterned hard mask layer 131 (see FIG. 3) remaining after performing the patterning process are removed using suitable removing processes, such as suitable etching processes, for example. The TEs 129', the MTJs 127', and the BEs 119' form MTJ structures 401 over the substrate 101. In some embodiments, the TEs 129', the MTJs 127', and the BEs 119' have sloped sidewalls, such that the MTJ structures 401 have sloped sidewalls. In some embodiments, a width of the TEs 129' is less than a width of the BEs 119'.

In some embodiments, the one or more etching processes may include a plasma etching method, such as an IBE process. In some embodiments, the IBE process may be performed in conjunction with a magnetic treatment that allows for avoiding the electrical shorting caused by the re-sputtering of metal elements on sidewalls of the MTJs 127' occurring during the IBE process. In some embodiments, the magnetic treatment removes metallic particles from the sidewalls of the MTJs 127'. In some embodiments, the IBE process and the magnetic treatment process is performed using a system 1000 described below with reference to FIGS. 10-12 and detailed description of the IBE process and the magnetic treatment are provided at that time.

Figure 5:
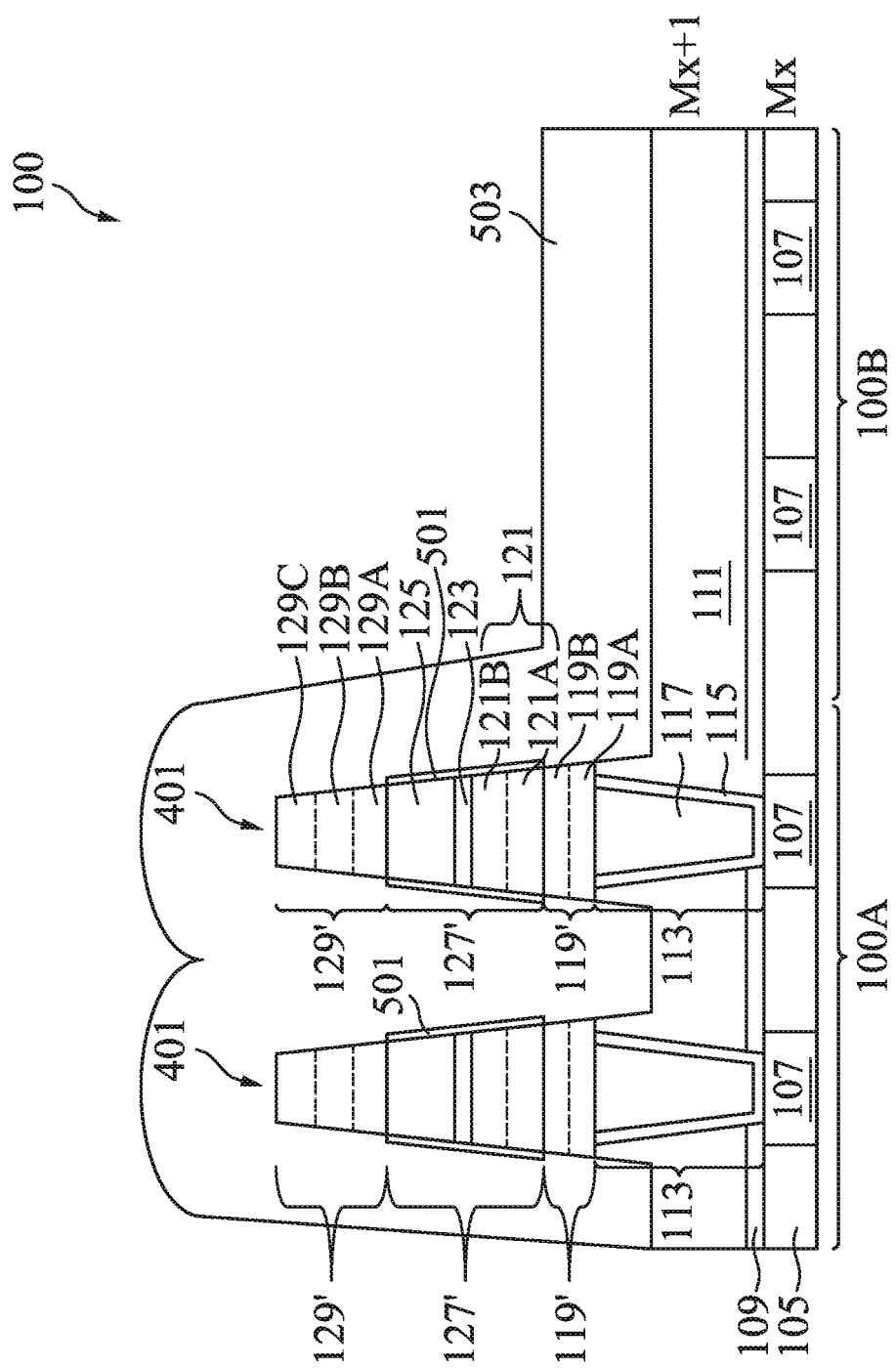

Referring to FIG. 5, after performing the IBE process and the magnetic treatment process, various protective layers are formed on sidewalls and top surfaces of the MTJ structures 401. In some embodiments, oxide layers 501 are formed on sidewalls of the MTJs 127'. In some embodiments, the oxide layers 501 comprise oxides of metal elements forming the MTJs 127' and may be formed using an oxidation process. In some embodiments, the oxide layers 501 prevent electron flow along the sidewalls of the MTJs 127' that may adversely affect magnetic performance of the MTJs 127'. In some embodiment, the oxide layers 501 may have a thickness between about 5 Å and about 15 Å.

After forming the oxide layers 501, a passivation layer 503 is blanket formed over the MTJ structures 401. In some embodiments, the passivation layer 503 may comprise silicon oxide, silicon nitride, silicon oxynitride, silicon carbide, silicon carbonitride, a combination thereof, or the like, and may be formed using CVD, PECVD, ALD, PELAD, PVD, a combination thereof, or the like. In some embodiments, the passivation layer 503 may reduce or prevent moisture (H$_2$O) diffusion into the MTJ structures 401. In some embodiment, the passivation layer 503 may have a thickness between about 100 Å and about 800 Å. In some embodiments, processes for forming the oxide layers 501 and the passivation layer 503 are performed using the system 1000 described below with reference to FIG. 10 and detailed description of these processes is provided at that time.

Figure 6:
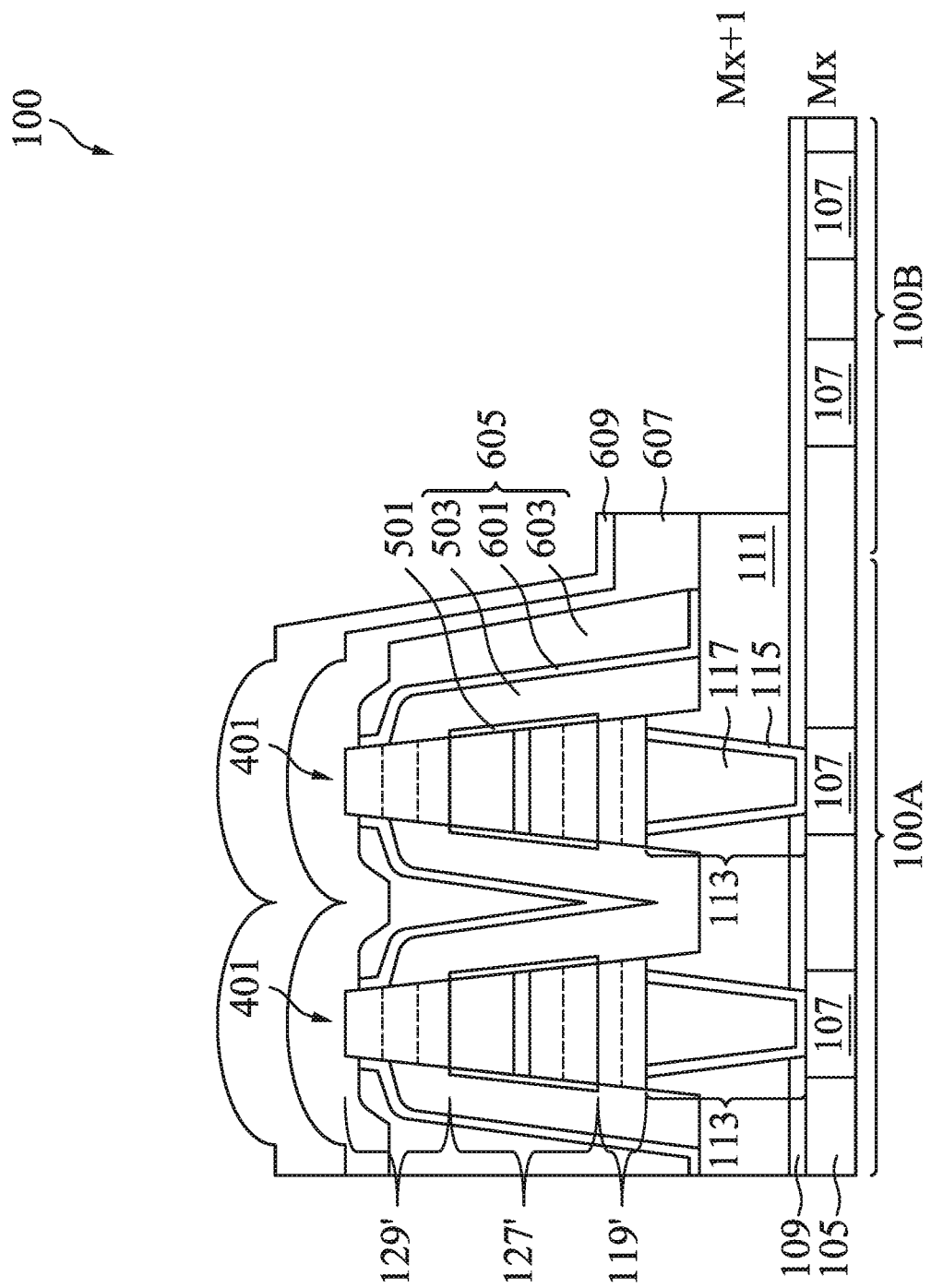

Referring to FIG. 6, a dry etching process is performed to etch the passivation layer 503 and to expose top portions of the MTJ structures 401 (e.g., top portions of the TEs 129'). In some embodiments, the dry etching process is an anisotropic etching process and removes horizontal portions of the passivation layer 503. Subsequently, a passivation layer 601 is formed over the MTJ structures 401, followed by an oxide layer 603 formed over the passivation layer 601. In some embodiments, the passivation layer 601 may be formed using similar materials and methods as the passivation layer 503 described above with reference to FIG. 5 and the description is not repeated herein. In some embodiments, the oxide layer 603 may comprise silicon oxide, or the like, and may be formed using CVD, PECVD, ALD, PELAD, a combination thereof, or the like. Subsequently, one or more dry etching processes are performed to etch the passivation layer 601 and the oxide layer 603 and to expose top portions of the MTJ structures 401 (e.g., portions of the TEs 129'). In some embodiments, the one or more dry etching processes are anisotropic etching processes and remove horizontal portions of the passivation layer 601 and the oxide layer 603. The remaining portions of the passivation layer 503, the passivation layer 601 and the oxide layer 603 form spacers 605 on the sidewalls of the MTJ structures 401.

Referring further to FIG. 6, a dielectric layer 607 is formed over the MTJ structures 401 and the spacers 605, and a nitrogen-free anti-reflective layer (NFARL) 609 is formed over the dielectric layer 607. In some embodiments, the dielectric layer 607 comprises a low-k oxide, such as a TEOS oxide (silicon oxide deposited using, e.g., a CVD method with Tetra Ethyl Ortho Silicate (TEOS) as a precursor), or the like. Subsequently, the dielectric layer 607 and the NFARL 609 are patterned to expose the etch stop layer 109 in the logic region 100B of the semiconductor device 100. In some embodiments, the patterning process may comprise suitable photolithography and etching processes.

Figure 7:
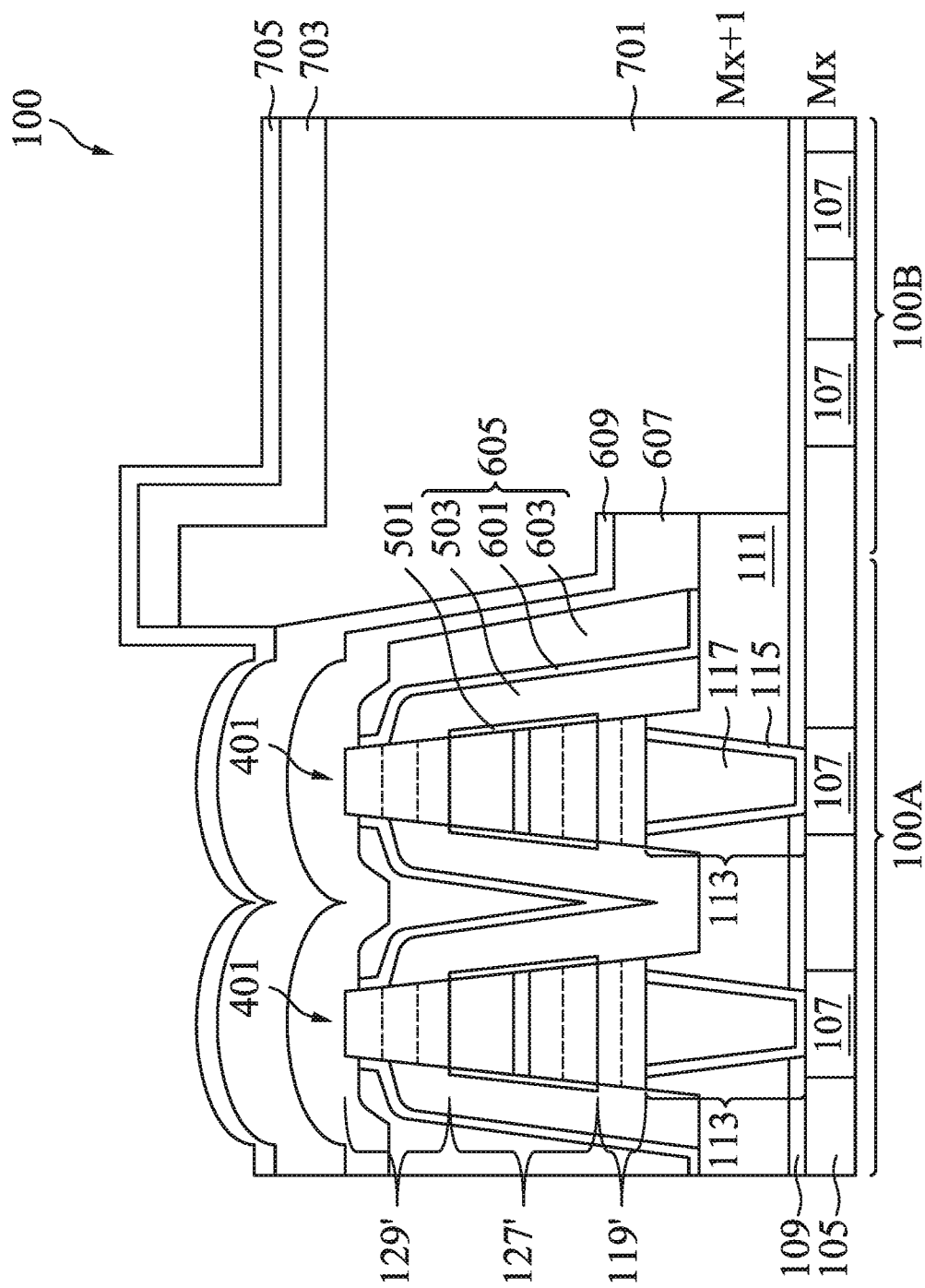

Referring to FIG. 7, a dielectric layer 701 is formed over the etch stop layer 109 in the logic region 100B of the semiconductor device 100, and a nitrogen-free anti-reflective layer (NFARL) 703 is formed over the dielectric layer 701. In some embodiments, the dielectric layer 701 may be formed using similar materials and methods as the dielectric layer 105 described above with reference to FIG. 1 and the description is not repeated herein. In some embodiments, the memory region 100A of the semiconductor device 100 may be protected by a mask while forming the dielectric layer 701 and the NFARL 703 in the logic region 100B of the semiconductor device 100. Subsequently, a mask layer 705 is blanket formed over the semiconductor device 100. In some embodiments, the mask layer 705 may comprise TiN, TaN, or the like.

Figure 8:
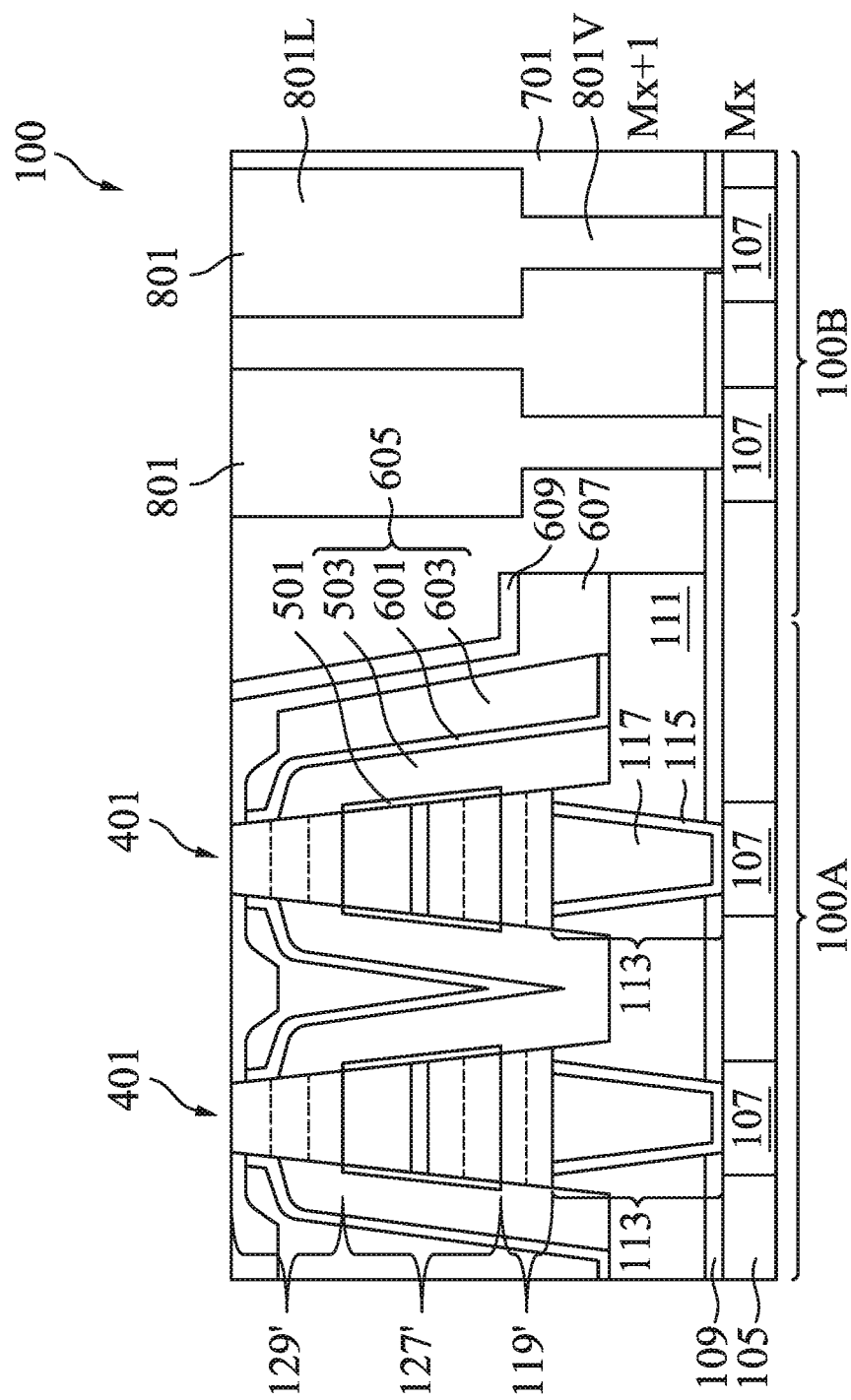

Referring to FIG. 8, the conductive features 801 are formed in the dielectric layer 701. The conductive features 801 may include conductive lines 801L and vias 801V formed using suitable formation methods such as damascene, dual-damascene, deposition, plating, combinations thereof, or the like. In some embodiments, the mask layer 705 and the NFARL 703 (see FIG. 7) aid in formation of conductive feature openings in the dielectric layer 701 and the etch stop layer 109. In some embodiments, the conductive feature openings are formed by a via-first process. In other embodiments, the conductive feature openings are formed by a trench-first process. Subsequently, the conductive feature openings are filled with suitable conductive materials. Next, a planarization process, such a CMP process, is performed to remove excess materials over the MTJ structures 401 and expose the topmost surfaces of the MTJ structures 401. In some embodiments, the topmost surfaces of the MTJ structures 401 are level with the topmost surfaces of the conductive features 801. In some embodiments, the planarization process completely removes the mask layer 705 and the NFARL 703 (see FIG. 7).

Figure 9:
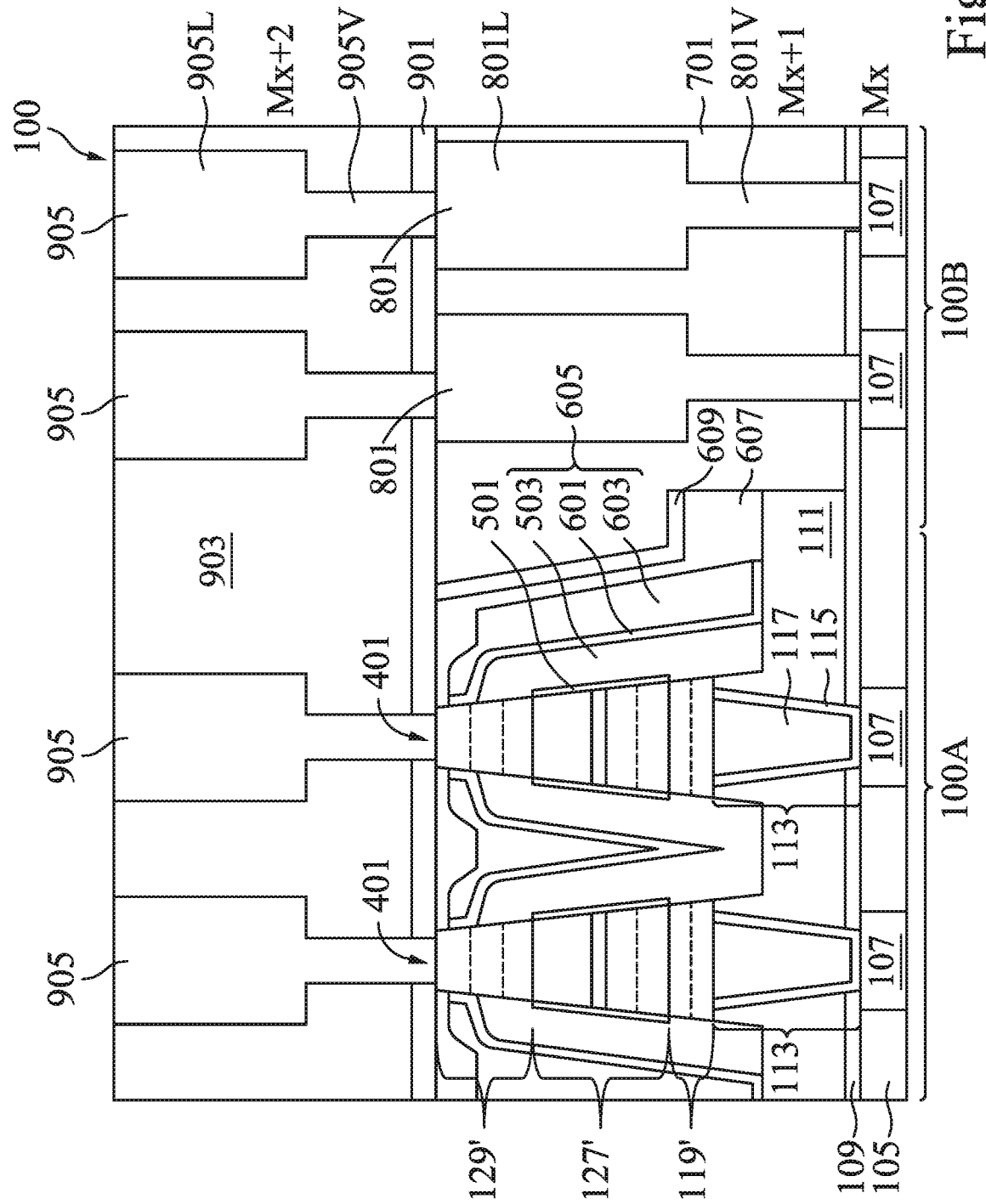

Referring to FIG. 9, after forming the conductive features 801, a metallization layer $M_{x+2}$ is formed over the MTJ structures 401, the dielectric layer 701 and the conductive features 801. In some embodiments, the formation of the metallization layer $M_{x+2}$ comprises forming an etch stop layer 901 over the MTJ structures 401, the dielectric layer 701 and the conductive features 801. Subsequently, a dielectric layer 903 is formed over the etch stop layer 901. In some embodiments, the etch stop layer 901 may be formed using similar materials and methods as the etch stop layer 109 described above with reference to FIG. 1 and the description is not repeated herein. In some embodiments, the dielectric layer 903 may be formed using similar materials and methods as the dielectric layer 105 described above with reference to FIG. 1 and the description is not repeated herein. Subsequently, conductive features 905 (e.g., conductive lines 905L and vias 905V) are formed in the dielectric layer 903. The conductive features 905 extend through the etch stop layer 901 and are electrically coupled to the conductive features 801 and the MTJ structures 401. In some embodiments, the conductive features 905 may formed using similar materials and methods as the conductive features 801 described above with reference to FIG. 8 and description is not repeated herein. The particular number of MTJ structures 401 and the conductive features 801 and 905 as shown in FIG. 9 are provided for the purpose of illustration only. Other numbers of MTJ structures 401 and the conductive features 801 and 905 are also possible and are fully intended to be included within the scope of the present disclosure.

Additional processing may follow the processing illustrated in FIG. 9 to complete the manufacturing of the semiconductor device 100, as one skilled in the art will readily appreciate, thus details are not discussed here. For example, one or more additional metallization layers may be formed over the metallization layer $M_{x+2}$ until the formation of the interconnect structure is completed.

Figure 10:
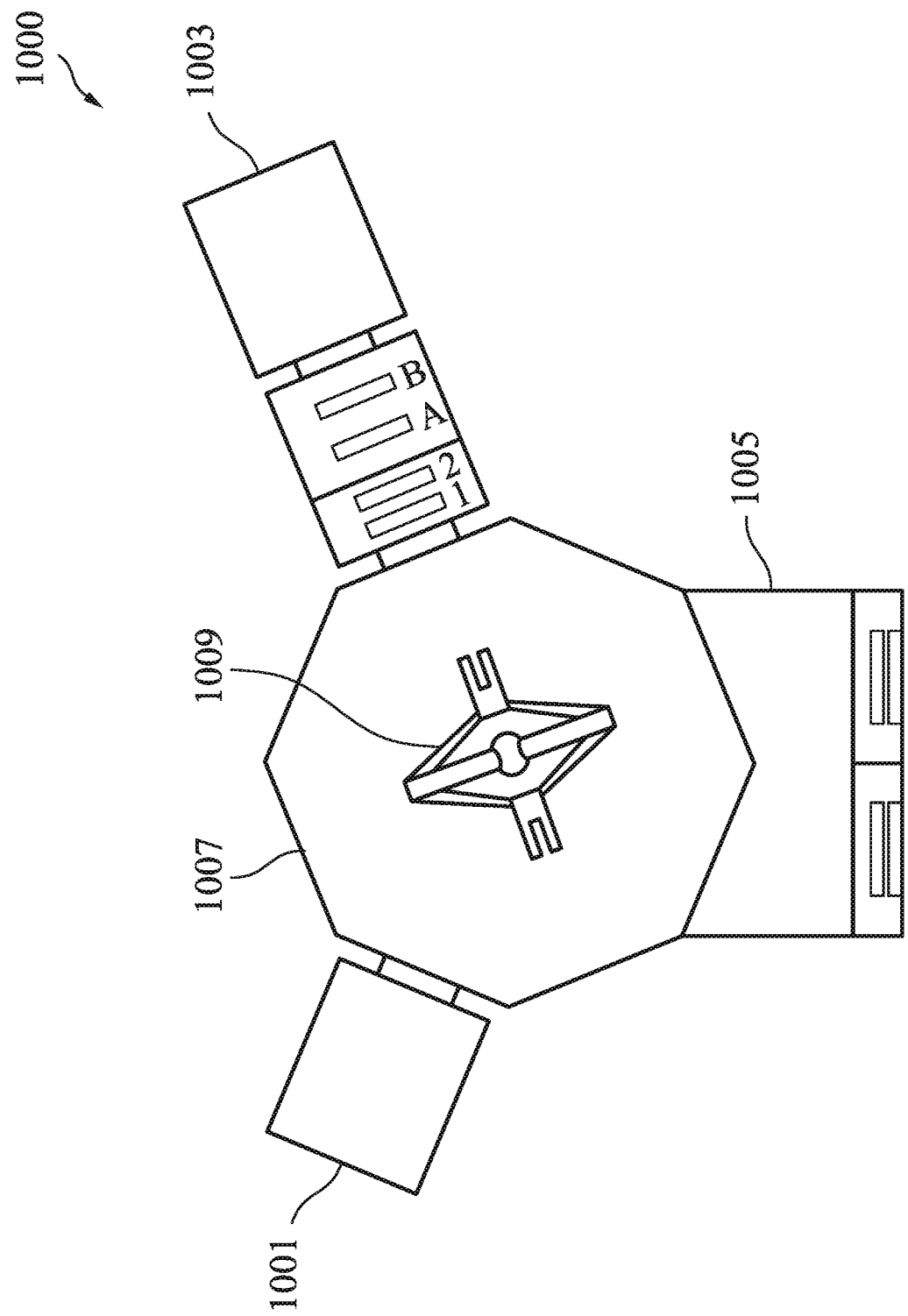
FIG. 10 illustrates a system used in various stages of formation of a semiconductor device in accordance with some embodiments.

FIG. 10 illustrates a system 1000 used in various stages of formation of the semiconductor device 100 in accordance with some embodiments. In some embodiments, the process steps described with reference to FIGS. 4 and 5 may be performed using the system 1000. In some embodiments, the system 1000 comprises an etching/magnetic treatment station 1001, an oxidation/deposition station 1003, a loadlock chamber 1005, and a transfer chamber 1007. In some embodiments, the process steps described with reference to FIG. 4 are performed using the etching/magnetic treatment station 1001. In some embodiments, the process steps described with reference to FIG. 5 are performed using the oxidation/deposition station 1003. In some embodiments, the semiconductor device 100 illustrated in FIG. 3 is loaded into the system 1000 to perform the process steps described above with reference to FIGS. 4 and 5.

In some embodiments, the etching/magnetic treatment station 1001 is configured to perform the magnetic treatment processes in conjunction with the IBE process by performing one or more process cycles. In some embodiments, each cycle comprises an IBE stage followed by a magnetic treatment stage. In some embodiments, the one or more process cycles may comprise from 1 to 6 cycles. In some embodiments, the oxidation/deposition station 1003 is configured to perform an oxidation process and a deposition process.

In some embodiments, the loadlock chamber 1005 opens to the exterior atmosphere and receives the semiconductor device 100 illustrated in FIG. 3. Once the semiconductor device 100 is disposed within the loadlock chamber 1005, the loadlock chamber 1005 can close, isolating the semiconductor device 100 from the exterior atmosphere. Once isolated, the loadlock chamber 1005 can then have the remaining exterior atmosphere evacuated in preparation for moving the semiconductor device 100 into the remainder of the system 1000 through, e.g., the transfer chamber 1007. The transfer chamber 1007 may comprise one or more robotic arms 1009 that can grip, move, and transfer the semiconductor device 100 from the loadlock chamber 1005 to, e.g., the etching/magnetic treatment station 1001. In some embodiments, the robotic arms 1009 may extend into the loadlock chamber 1005, grip the semiconductor device 100, and transfer the semiconductor device 100 into the transfer chamber 1007. Once inside, the transfer chamber 1007 may have doors that close to isolate the transfer chamber 1007 from the loadlock chamber 1005 so that the loadlock chamber 1005 may again be opened to the exterior atmosphere without contaminating the remainder of the system 1000. Once isolated from the loadlock chamber 1005, the transfer chamber 1007 may open to the etching/magnetic treatment station 1001 and the robotic arms 1009, still holding the semiconductor device 100, extends into the etching/magnetic treatment station 1001 and deposits the semiconductor device 100 for further processing. Once the semiconductor device 100 is placed in the etching/magnetic treatment station 1001, process steps described above with reference to FIG. 4 are performed by the etching/magnetic treatment station 1001. Subsequently, the semiconductor device 100 is transferred to the oxidation/deposition station 1003 through the transfer chamber 1007. Once the semiconductor device 100 is placed in the oxidation/deposition station 1003, process steps described above with reference to FIG. 5 are performed by the oxidation/deposition station 1003.

Figure 11:
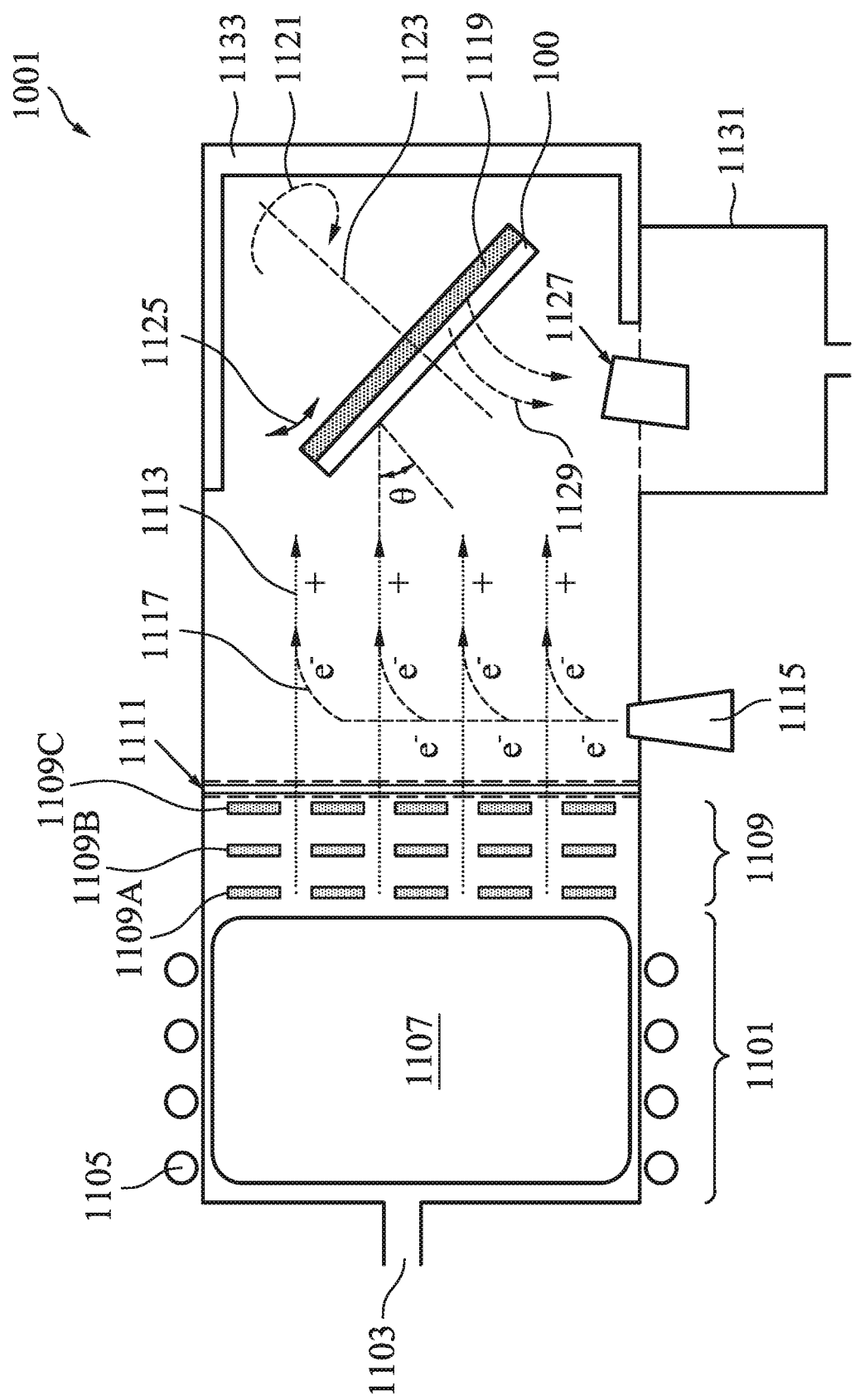
FIG. 11 illustrates an etching/magnetic treatment chamber during an etching stage in accordance with some embodiments.

FIG. 11 illustrates the etching/magnetic treatment station 1001 during an etching stage in accordance with some embodiments. In some embodiment, the etching/magnetic treatment station 1001 comprises a plasma chamber 1101. The plasma chamber 1101 may also be referred to as a discharge chamber. A gas inlet 1103 provides suitable process gasses to the plasma chamber 1101. In some embodiments, the suitable process gasses include inert gases, such as He, Ne, Ar, Kr, Xe, Ra, a combination thereof, or the like. A plasma generator 1105 generates plasma 1107 from the process gases. In some embodiments, the plasma generator 1105 is coupled to a radio-frequency (RF) power source (not shown). In some embodiments, the plasma generator 1105 may be a transformer-coupled plasma generator, inductively coupled plasma system, magnetically enhanced reactive ion etch system, electron cyclotron resonance system, a remote plasma generator, or the like. In some embodiment, the RF power source is operated at a power between about 50 W and about 500 W.

In some embodiment, the etching/magnetic treatment station 1001 further comprises a grid optics 1109. In some embodiments, the grid optics 1109 comprises the electrostatic apertures by which the ions from the plasma 1107 are extracted and an ion beam 1113 is formed. In some embodiments, the grid optics 1109 comprises one or more grids. In some embodiments, each grid comprises an electrode having a plurality of apertures. The plurality of apertures in different grids are aligned to allow for the extraction of ions of the plasma 1107. In some embodiments, the grid optics 1109 comprises a screen (S) grid 1109A, an accelerator (A) grid 1109B, and a decelerator (D) grid 1109C. The S grid 1109A is disposed closest to the plasma chamber 1101. The A grid 1109B is interposed between the S grid 1109A and the D grid 1109C. The S grid 1109A is biased by a positive voltage (a beam voltage) with respect to ground. In some embodiments, the beam voltage may be between about 100 V and about 1000 V. The A grid 1109B is biased by a negative voltage with respect to ground. The D grid 1109C is coupled to ground. The ions created in the plasma chamber 1101 are accelerated to high velocities with the grid optics 1109 to form the ion beam 1113. In some embodiments, a neutralizer 1115 is placed downstream from the plasma 1107. The neutralizer 1115 emits electrons 1117 to balance the number of ions in the ion beam 1113. The electrons 1117 provide a charge balance for the ions in the ion beam 1113, which allows for minimizing or eliminating a space or surface charging that may occur during the etching process.

In some embodiment, the etching/magnetic treatment station 1001 further comprises a chuck 1119 configured to hold the semiconductor device 100 while performing various process steps. In some embodiments, the chuck 1119 is a vacuum chuck, an electrostatic chuck, or the like. In some embodiments, the chuck 1119 is configured to rotate (illustrated by an arrow 1121 in FIG. 11) around an axis 1123 and to tilt (illustrated by an arrow 1125 in FIG. 11) with respect to a direction of the ion beam 1113 impacting the semiconductor device 100. In some embodiments, a tilt angle θ (an angle between the direction of the ion beam 1113 and a normal to the chuck 1119) of the chuck 1119 is between about 90° and about −70°. In some embodiments, a rotation speed of the chuck 1119 is between about 5 rpm and about 100 rpm. In some embodiments, a mechanical shutter 1111 is placed between the grid optics 1109 and the chuck 1119. In some embodiments, the mechanical shutter 1111 may be closed to prevent the ion beam 1113 from impacting the semiconductor device 100 placed on the chuck 1119. During the IBE stage the mechanical shutter 1111 is open. During the magnetic treatment stage the mechanical shutter 1111 is closed.

In some embodiment, the etching/magnetic treatment station 1001 further comprises an end point detection system 1127 that is configured to detect byproducts of the IBE process (illustrated by arrows 1129 in FIG. 11) and to stop the IBE process when desired byproducts are detected. In some embodiments, the etching/magnetic treatment station 1001 further comprises a pump 1131 that is configured to evacuate the byproducts of the IBE process from the etching/magnetic treatment station 1001. In some embodiments, the etching/magnetic treatment station 1001 further comprises a magnetic system 1133 that is configured to generate a magnetic field during the magnetic treatment stage.

In some embodiments, the magnetic system 1133 comprises a conductive layer lining walls of the etching/magnetic treatment station 1001 that surround the chuck 1119 and the semiconductor device 100 placed on the chuck 1119. In other embodiments, the magnetic system 1133 may comprise coils, solenoids, electromagnets, or other components for generating a magnetic field. In some embodiments, the conductive layer may comprise one or more layers of aluminum, iron, nickel, a combination thereof, or the like. In some embodiments, the magnetic system 1133 generates a magnetic field by passing an electric current through the magnetic system 1133.

Referring further to FIG. 11, during the IBE stage, the mechanical shutter 1111 is open and the ion beam 1113 from the plasma 1107 generated by the plasma generator 1105 impacts the semiconductor device 100 placed on the chuck 1119. In some embodiments, etch rate of the ion beam 1113 may be changed by changing the tilt angle θ of the chuck 1119. In some embodiments, the IBE stage may be performed for a duration between about 10 sec to 500 sec.

Figure 12:
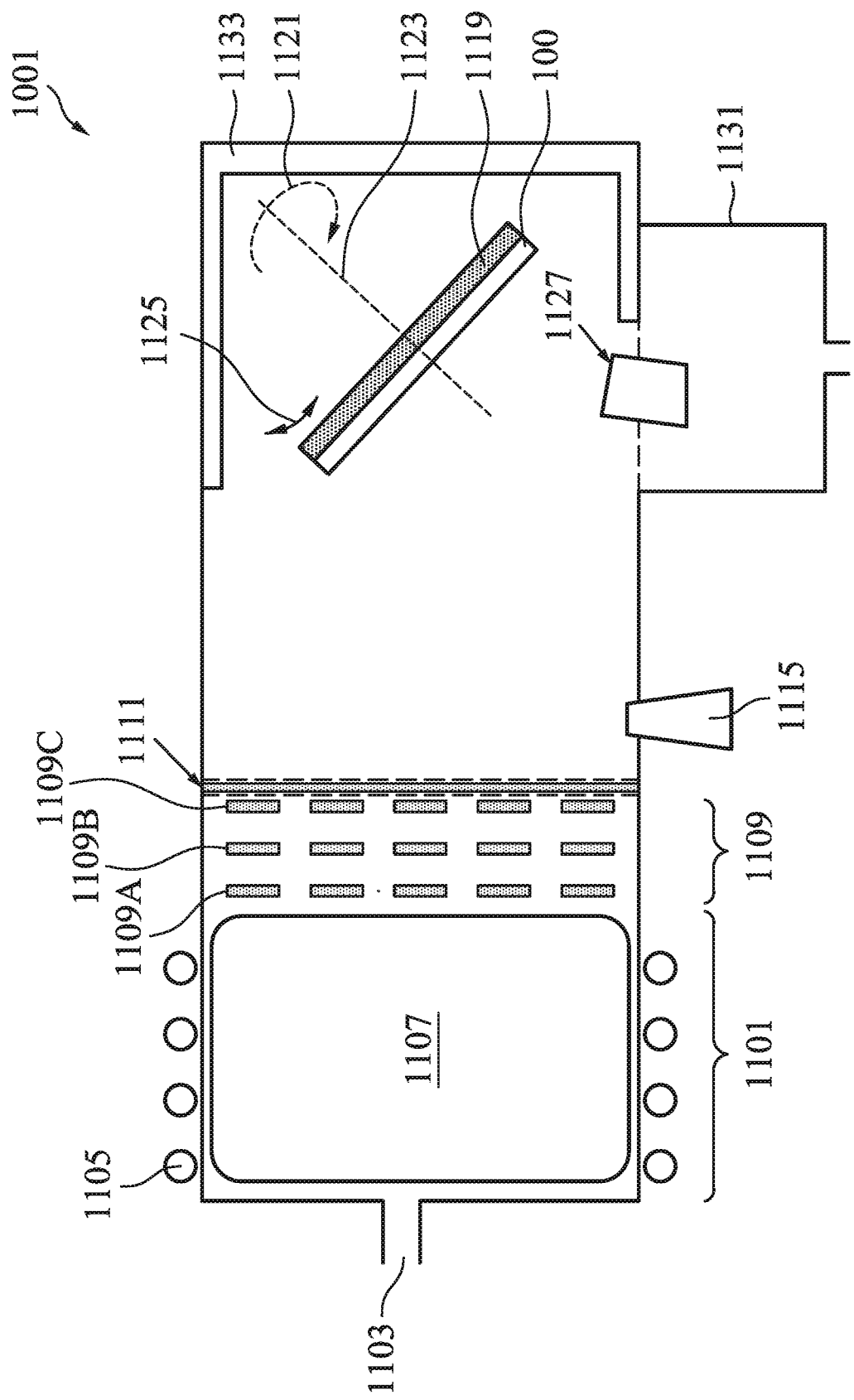
FIG. 12 illustrates an etching/magnetic treatment chamber during a magnetic treatment stage in accordance with some embodiments.

FIG. 12 illustrates the etching/magnetic treatment station 1001 during the magnetic treatment stage in accordance with some embodiments. In some embodiments, during the magnetic treatment stage, the mechanical shutter 1111 is closed and the ion beam 1113 (see FIG. 11) is prevented from impacting the semiconductor device 100 that is placed on the chuck 1119. In other embodiments, the plasma generator 1105 may be turned off so that the plasma 1107 and the ion beam 1113 (see FIG. 11) are not generated. In some embodiments, during the magnetic treatment stage, the magnetic field is generated by the magnetic system 1133 around the semiconductor device 100. In some embodiments, the magnetic system 1133 generates the magnetic field by passing an electric current through the magnetic system 1133. In some embodiments, the electric current is between about 100 mA and 2000 mA. In some embodiments, the magnetic treatment stage may be performed in an inert gas atmosphere comprising He, Ne, Ar, Kr, Xe, Ra, a combination thereof, or the like. In some embodiments, the magnetic treatment stage may be performed for a duration between about 10 sec to 100 sec. In some embodiments, a ratio of the duration of the IBE stage to the duration of the magnetic treatment stage is between about 5:1 and about 1:3. In some embodiments, the magnetic treatment removes metal particles that are re-sputtered on sidewalls of the MTJs 127' during IBE stages. In some embodiments, during the magnetic treatment stage, the magnetic system 1133 generates a magnetic field, which attracts the re-sputtered metal particles and removes them from the sidewalls of the MTJs 127'. Accordingly, the electrical shorting caused by the metal particles is reduced or avoided.

Referring further to FIGS. 5 and 10, after performing the IBE and magnetic treatment processes as described above with reference to FIGS. 3 and 10-12, the semiconductor device 100 is transferred to the oxidation/deposition station 1003. In some embodiments, after placing the semiconductor device 100 in the oxidation/deposition station 1003, the oxide layers 501 are formed on sidewall of MTJs 127'. In some embodiments, the oxide layers 501 may be formed using an oxidation process comprising thermal oxidation, PECVD, a combination thereof, or the like. In some embodiments where PECVD is used to form the oxide layers 501, $N_2O$ may be used as an oxygen source. In some embodiments, PECVD may be performed with an RF power between about 10 W and about 100 W. In some embodiments where the RF power is less than about 10 W, the oxidation process may not be effective and desired thickness of the oxidation layers 501 may not be achieved. In some embodiments where the RF power is greater than about 100 W, the oxidation process may damage the MTJs 127'. In some embodiments, the oxidation process is performed at a temperature between 20° C. and about 200° C. In some embodiments, the oxidation process is performed at a pressure between about 0 Torr and about 10 Torr. In some embodiments, the oxidation process is performed for a duration between about 5 sec and about 50 sec. In some embodiments where the duration is greater than about 50 sec, the oxide layers 501 may be so thick that the MTJs 127' may be damaged by the oxidation process. In some embodiments where the duration is less than about 5 sec, the oxide layers 501 may be so thin that electrons may flow along the sidewalls of the MTJs 127' and adversely affect device performance. In some embodiment, a thickness of the oxide layers 501 is between about 5 Å and about 15 Å. In some embodiments where the thickness of the oxide layers 501 is greater than about 15 Å, the MTJs 127' may be damaged by oxidation process. In some embodiments where the thickness of the oxide layers 501 is less than about 5 Å, electrons may flow along the sidewalls of the MTJs 127' and adversely affect device performance.

Referring further to FIGS. 5 and 10, after forming the oxide layer 501, the oxidation/deposition station 1003 forms the passivation layer 503 over the MTJ structures 401. In some embodiments, the passivation layer 503 may be formed using PECVD, PVD, ALD, PEALD, a combination thereof, or the like. In some embodiments, the passivation layer 503 comprising silicon nitride is formed by PECVD using $SiH_4$ and $NH_3$ as silicon and nitrogen precursors, respectively. In some embodiments, a flow rate of $SiH_4$ may be between about 10 sccm and about 1000 sccm. In some embodiments, a flow rate of $NH_3$ may be between about 1 sccm and about 100 sccm. In some embodiments, in addition to the silicon and nitrogen precursors, a carrier gas may be also used. The carrier gas may be He, $N_2$, Ar, a combination thereof, or the like. In some embodiments, PECVD may be performed at a temperature between about 50° C. and about 250° C. In some embodiments, PECVD may be performed at a pressure between about 0 Torr and about 10 Torr. In some embodiments, the RF power of PECVD may be between about 50 W and about 600 W. In some embodiments where the temperature is greater than about 250° C. and the MTJs 127' comprise Mg, Mg ions may diffuse and the magnetism of the MTJs 127' may be affected. In some embodiments where the temperature is less than about 50° C., the magnetism of the MTJs 127' may be affected by moisture ($H_2O$). In some embodiments, the passivation layer 503 may have a thickness between about 100 Å and about 800 Å. In some embodiments, the passivation layer 503 may have a refractive index (RI) between about 2.0 and about 2.3.

In some embodiments, the passivation layer 503 comprising silicon nitride is formed using PVD. In such embodiments, a Si target is sputtered in an Ar/$N_2$ atmosphere. In some embodiments, PVD is performed at a temperature between about 50° C. and about 400° C. In some embodiments, an RF power of PVD is between about 100 W and about 500 W.

In some embodiments, the passivation layer 503 comprising silicon nitride is formed by PEALD using $SiH_4$ and $N_2$ as silicon and nitrogen precursors, respectively. In some embodiments, an RF power of PEALD is between about 20 W and about 300 W. In some embodiments, PEALD is performed at a temperature between about 100° C. and about 400° C.

Figure 13:
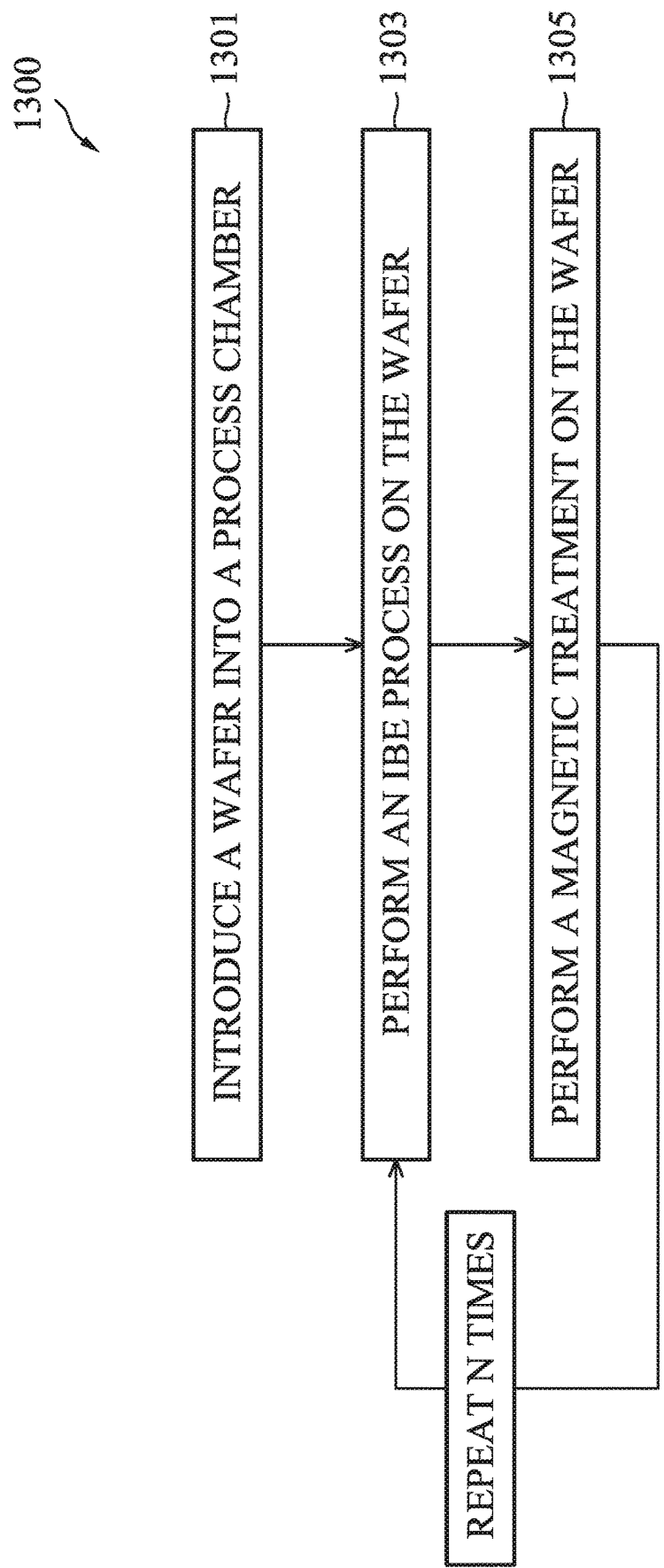
FIG. 13 illustrates a process flow of an etching/magnetic treatment process in accordance with some embodiments.

FIG. 13 illustrates a process flow of an etching/magnetic treatment process 1300 in accordance with some embodiments. In some embodiments, the etching/magnetic treatment process 1300 starts with step 1301, where a wafer (such as the semiconductor device 100 illustrated in FIG. 3) is introduced into a process chamber (such as the etching/magnetic treatment station 1001 illustrated in FIGS. 10 and 11). In step 1303, the process chamber performs an IBE process on the wafer as described above with reference to FIGS. 4, 10 and 11. In step 1305, the process chamber performs a magnetic treatment on the wafer as described above with reference to FIGS. 4, 10 and 12. In some embodiments, a cycle comprising step 1303 followed by step 1305 may be repeated N time. In some embodiments, N may be between 1 and 6.

Figure 14:
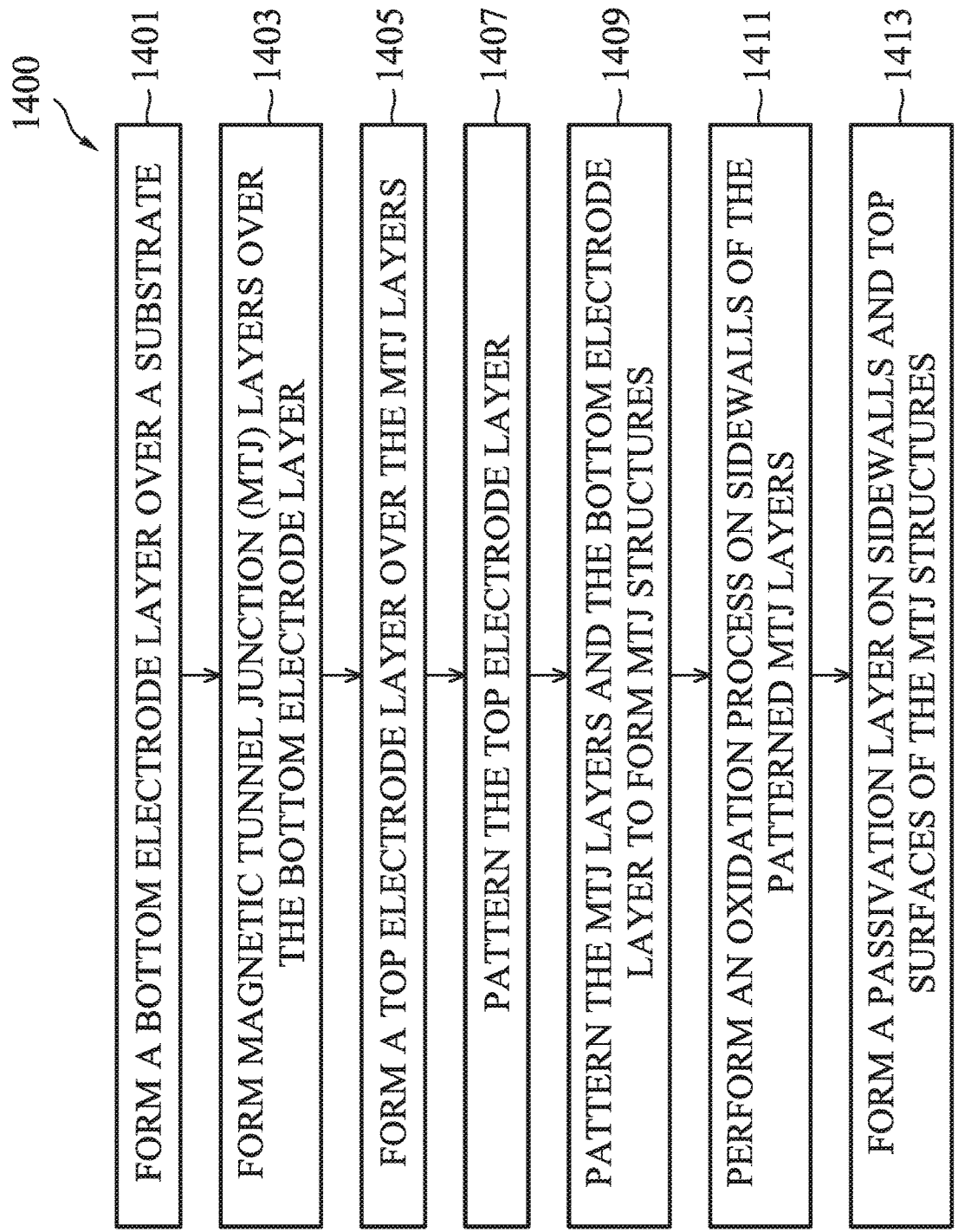
FIG. 14 illustrates a process flow of a method of forming a semiconductor device in some embodiments.

FIG. 14 illustrates a process flow of a method 1400 of forming a semiconductor device in some embodiments. In some embodiments, the method 1400 starts with step 1401, where a bottom electrode layer (such as the BE layer 119 illustrated in FIG. 1) is formed over a substrate as described above with reference to FIG. 1. In step 1403, magnetic tunnel junction (MTJ) layers (such as the MTJ layers 127 illustrated in FIG. 1) are formed over the bottom electrode layer as described above with reference to FIG. 1. In step 1405, a top electrode layer (such as the TE layer 129 illustrated in FIG. 1) is formed over the MTJ layers as described above with reference to FIG. 1. In step 1407, the top electrode layer is patterned as described above with reference to FIGS. 2 and 3. In step 1409, the MTJ layers and the bottom electrode layer are patterned to form MTJ structures (such as the MTJ structures 401 illustrated in FIG. 4) as described above with reference to FIGS. 4 and 10-12. In some embodiments, performing step 1409 comprises performing the etching/magnetic treatment process 1300 described above with reference to FIG. 13. In step 1411, an oxidation process is performed on sidewalls of the patterned MTJ layers (such as the sidewalls of the MTJs 127') as described above with reference to FIGS. 5 and 10. In step 1413, a passivation layer (such as the passivation layer 503 illustrated in FIG. 5) is formed on sidewalls and top surfaces of the MTJ structures as described above with reference to FIGS. 5 and 10.

In an embodiment, a method includes: forming a bottom electrode layer over a substrate; forming a magnetic tunnel junction (MTJ) layers over the bottom electrode layer; forming a top electrode layer over the MTJ layers; patterning the top electrode layer; and after patterning the top electrode layer, performing one or more process cycles on the MTJ layers and the bottom electrode layer, where a patterned top electrode layer, patterned MTJ layers and a patterned bottom electrode layer form MTJ structures, and where each of the one or more process cycles includes: performing an etching process on the MTJ layers and the bottom electrode layer for a first duration; and performing a magnetic treatment on the MTJ layers and the bottom electrode layer for a second duration. In an embodiment, performing the etching process includes performing an ion beam etching process. In an embodiment, the method further includes performing an oxidation process on the MTJ structures, where the oxidation process forms oxide layers on sidewalls of patterned MTJ layers. In an embodiment, the method further includes forming a passivation layer along sidewalls and top surfaces of the MTJ structures. In an embodiment, the oxide layers and the passivation layer are formed in a same process chamber. In an embodiment, the etching process and magnetic treatment are performed in a same process chamber. In an embodiment, a ratio of the first duration to the second duration is between about 5:1 and about 1:3.

In another embodiment, a method includes: introducing a wafer in a process chamber, the wafer including: a bottom electrode layer over a substrate; a magnetic tunnel junction (MTJ) layers over the bottom electrode layer; and a patterned top electrode layer over the MTJ layers; performing one or more process cycles on the wafer while the wafer is in the process chamber, where each of the one or more process cycles includes: performing, using an ion beam etching (IBE) system of the process chamber, an IBE process on the MTJ layers and the bottom electrode layer for a first duration; and performing, using a magnetic system of the process chamber, a magnetic treatment on the MTJ layers and the bottom electrode layer for a second duration. In an embodiment, a ratio of the first duration to the second duration is between about 5:1 and about 1:3. In an embodiment, the magnetic system generates a magnetic field around the wafer. In an embodiment, the magnetic treatment removes metal particles from sidewalls of patterned MTJ layers. In an embodiment, the one or more process cycles includes between 1 and 6 process cycles. In an embodiment, the method further includes, after performing the IBE process, closing a mechanical shutter disposed between the IBE system and the magnetic system. In an embodiment, performing the magnetic treatment includes passing an electric current through the magnetic system to generate a magnetic field.

In yet another embodiment, a device includes: a substrate; a magnetic tunnel junction (MTJ) structure over the substrate, where the MTJ structure includes: a bottom electrode; an MTJ stack over the bottom electrode; and a top electrode over the MTJ stack; an oxide layer on a sidewall of the MTJ stack; and a spacer on a sidewall of the MTJ structure, where the spacer is in physical contact with a sidewall of the bottom electrode, a sidewall of the top electrode and the oxide layer. In an embodiment, the device further includes a metallization layer between the substrate and the MTJ structure, where the bottom electrode of the MTJ structure is electrically coupled to a conductive feature of the metallization layer. In an embodiment, the device further includes a metallization layer over the MTJ structure, where the top electrode of the MTJ structure is electrically coupled to a conductive feature of the metallization layer. In an embodiment, a width of the bottom electrode is greater than a width of the top electrode. In an embodiment, the MTJ stack has sloped sidewalls. In an embodiment, a thickness of the top electrode is greater than a thickness of the bottom electrode.

In yet another embodiment, a device includes: a substrate; a dielectric layer over the substrate; a first conductive feature in the dielectric layer; a magnetic tunnel junction (MTJ) structure over the dielectric layer, the MTJ structure having a sloped sidewall, where the MTJ structure includes: a bottom electrode in physical contact with first conductive feature; an MTJ stack over the bottom electrode; and a top electrode over the MTJ stack; an oxide layer extending along the sloped sidewall of the MTJ structure from a bottommost surface of the MTJ stack to a topmost surface of the MTJ stack; and a spacer extending along the sloped sidewall of the MTJ structure, where the spacer is in physical contact with the bottom electrode, the top electrode, and the oxide layer, and where a portion of the spacer extends into the dielectric layer. In an embodiment, the MTJ stack includes a metallic element, and the oxide layer includes an oxide of the metallic element. In an embodiment, the spacer includes a plurality of dielectric layers. In an embodiment, the first conductive feature has a sloped sidewall. In an embodiment, a top surface of the first conductive feature is above a bottom surface of the spacer. In an embodiment, a top surface of the top electrode is above a top surface of the spacer. In an embodiment, the device further includes a metallization layer over the MTJ structure, where the top electrode of the MTJ structure is in physical contact with a second conductive feature of the metallization layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a substrate;
   a magnetic tunnel junction (MTJ) structure over the substrate, wherein the MTJ structure comprises:
      a bottom electrode;
      an MTJ stack over the bottom electrode; and
      a top electrode over the MTJ stack;
   an oxide layer on a sidewall of and in contact with the MTJ stack; and
   a spacer on a sidewall of the MTJ structure, wherein the spacer is in physical contact with a sidewall of the bottom electrode, a sidewall of the top electrode and the oxide layer.

2. The device of claim 1, further comprising a metallization layer between the substrate and the MTJ structure, wherein the bottom electrode of the MTJ structure is electrically coupled to a conductive feature of the metallization layer.

3. The device of claim 1, further comprising a metallization layer over the MTJ structure, wherein the top electrode of the MTJ structure is electrically coupled to a conductive feature of the metallization layer.

4. The device of claim 1, wherein a width of the bottom electrode is greater than a width of the top electrode.

5. The device of claim 1, wherein the MTJ stack has sloped sidewalls.

6. The device of claim 1, wherein a thickness of the top electrode is greater than a thickness of the bottom electrode.

7. A device comprising:
   a substrate;
   a dielectric layer over the substrate;
   a first conductive feature in the dielectric layer;
   a magnetic tunnel junction (MTJ) structure over the dielectric layer, the MTJ structure having a sloped sidewall, wherein the MTJ structure comprises:
      a bottom electrode in physical contact with first conductive feature;
      an MTJ stack over the bottom electrode; and
      a top electrode over the MTJ stack;
   an oxide layer extending along the sloped sidewall of the MTJ structure from a bottommost surface of the MTJ stack to a topmost surface of the MTJ stack; and
   a spacer extending along the sloped sidewall of the MTJ structure, wherein the spacer is in physical contact with the bottom electrode, the top electrode, and the oxide layer, and wherein a portion of the spacer extends into the dielectric layer.

8. The device of claim 7, wherein the MTJ stack comprises a metallic element, and wherein the oxide layer comprises an oxide of the metallic element.

9. The device of claim 7, wherein the spacer comprises a plurality of dielectric layers.

10. The device of claim 7, wherein the first conductive feature has a sloped sidewall.

11. The device of claim 7, wherein a top surface of the first conductive feature is above a bottom surface of the spacer.

12. The device of claim 7, wherein a top surface of the top electrode is above a top surface of the spacer.

13. The device of claim 7, further comprising a metallization layer over the MTJ structure, wherein the top electrode of the MTJ structure is in physical contact with a second conductive feature of the metallization layer.

14. A device comprising:
   a substrate;
   a dielectric layer over the substrate;
   a magnetic tunnel junction (MTJ) structure over the dielectric layer, wherein the MTJ structure comprises:
      a bottom electrode;
      an MTJ stack over the bottom electrode; and
      a top electrode over the MTJ stack;
   an oxide layer on a sidewall of the MTJ stack; and
   a spacer on a sidewall of the top electrode, a sidewall of the bottom electrode and a sidewall of the oxide layer, wherein the spacer physically contacts the bottom electrode, the top electrode, and the oxide layer, and wherein the spacer extends along a sidewall of the dielectric layer.

15. The device of claim 14, wherein the MTJ stack comprises a metallic element, and wherein the oxide layer comprises an oxide of the metallic element.

16. The device of claim 14, wherein the spacer comprises a plurality of dielectric layers.

17. The device of claim 14, wherein the sidewall of the dielectric layer is a sloped sidewall.

18. The device of claim 14, wherein the sidewall of the bottom electrode is a sloped sidewall.

19. The device of claim 15, wherein the sidewall of the MTJ stack is a sloped sidewall.

20. The device of claim 7, wherein a top surface of the top electrode is above a top surface of the spacer.

* * * * *